United States Patent
Kobayashi et al.

(10) Patent No.: US 7,521,334 B2
(45) Date of Patent: Apr. 21, 2009

(54) METHOD FOR PRODUCING DIRECT BONDED WAFER AND DIRECT BONDED WAFER

(75) Inventors: Norihiro Kobayashi, Gunma (JP); Toru Ishizuka, Gunma (JP); Tomohiko Ohta, Gunma (JP); Hiroji Aga, Gunma (JP); Yasuo Nagaoka, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 11/659,283

(22) PCT Filed: Nov. 29, 2005

(86) PCT No.: PCT/JP2005/021841

§ 371 (c)(1),
(2), (4) Date: Feb. 2, 2007

(87) PCT Pub. No.: WO2006/059586

PCT Pub. Date: Jun. 8, 2006

(65) Prior Publication Data

US 2008/0102603 A1    May 1, 2008

(30) Foreign Application Priority Data

Nov. 30, 2004    (JP)    ............... 2004-346235

(51) Int. Cl.
*H01L 21/30*    (2006.01)

(52) U.S. Cl. .................. 438/457; 257/E21.122
(58) Field of Classification Search ........... 438/457, 438/459
See application file for complete search history.

(56) References Cited

U.S. PATENT DOCUMENTS 4,939,101 A    7/1990    Black et al.

(Continued)

FOREIGN PATENT DOCUMENTS

EP    1 100 127 A1    5/2001

(Continued)

OTHER PUBLICATIONS

Shimbo et al; "Silicon-to-silicon direct bonding method;" *J. Appl. Phys.*; vol. 60; No. 8; American Institute of Physics; pp. 2987-2989; Oct. 15, 1986.

(Continued)

*Primary Examiner*—W. David Coleman
(74) *Attorney, Agent, or Firm*—Oliff & Berridge, PLC

(57) ABSTRACT

A method for producing a direct bonded wafer comprising: forming a thermal oxide film or a CVD oxide film on a surface of at least one of a bond wafer and a base wafer, and bonding the wafer to the other wafer via the oxide film; subsequently thinning the bond wafer to prepare a bonded wafer; and thereafter conducting a process of annealing the bonded wafer under an atmosphere including any one of an inert gas, hydrogen and a mixed gas of an inert gas and hydrogen so that the oxide film between the bond wafer and the base wafer is removed to bond the bond wafer directly to the base wafer. Thereby, there is provided a method for producing a direct bonded wafer in which generation of voids is reduced, and a direct bonded wafer with a low void count.

22 Claims, 4 Drawing Sheets

U.S. PATENT DOCUMENTS

2005/0118789 A1 6/2005 Aga et al.
2008/0014712 A1* 1/2008 Bourdelle et al. ........... 438/455

FOREIGN PATENT DOCUMENTS

| EP | 1 583 145 A1 | 10/2005 |
|---|---|---|
| JP | A 05-90117 | 4/1993 |
| JP | A 08-8413 | 1/1996 |
| JP | A 09-232197 | 9/1997 |
| JP | A 2000-36445 | 2/2000 |
| JP | A 2004-221198 | 8/2004 |
| WO | WO 2004/064145 A1 | 7/2004 |

OTHER PUBLICATIONS

Himi et al; "Silicon Wafer Direct Bonding without Hydrophilic Native Oxides;" *Jpn. J. Appl. Phys.*; vol. 33; Part 1; No. 1A; pp. 6-10; Jan. 1994.

* cited by examiner

FIGURE 6

| FORM A THERMAL OXIDE FILM OR A CVD OXIDE FILM ON A SURFACE OF AT LEAST ONE OF A BOND WAFER AND A BASE WAFER |

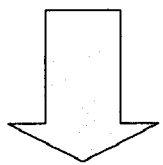

| BOND THE WAFER TO THE OTHER WAFER VIA THE OXIDE FILM |

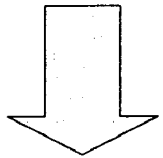

| THIN THE BOND WAFER TO PREPARE A BONDED WAFER |

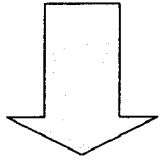

| ANNEAL THE BONDED WAFER UNDER AN ATMOSPHERE SO THAT THE OXIDE FILM BETWEEN THE BOND WAFER AND THE BASE WAFER IS REMOVED TO BOND THE BOND WAFER DIRECTLY TO THE BASE WAFER |

METHOD FOR PRODUCING DIRECT BONDED WAFER AND DIRECT BONDED WAFER

TECHNICAL FIELD

The present invention relates to a method for producing a direct bonded wafer and a direct bonded wafer which is obtained by bonding two wafers together directly and can be used for semiconductor devices.

BACKGROUND ART

Joining Si wafers together directly without sandwiching an insulator film such as an oxide film causes considerable generation of voids in the junction plane. There is a fact that bonding wafers together either or both of which is oxidized and has an oxide film with a certain thickness or more can produce less voids than the case of bonding wafers directly. However, the method is a production method of the so-called SOI (Silicon On Insulator) wafers, and use of the method leaves a buried oxide film at the junction interface. Consequently, a direct bonded wafer cannot be produced.

On the other hand, a method for producing a direct bonded wafer is disclosed in Japanese Unexamined Patent Application Publication No. 2000-36445. In the method, wafers with a native oxide film are bonded together at room temperature and undergo a heat treatment under an atmosphere except oxidizing atmosphere to diffuse and remove the oxide film layer at the bonding portion. However, even use of this method cannot reduce the void count enough.

What is mentioned above is summarized as follows. Firstly, direct bonding causes considerable generation of voids. Secondly, bonding after growing an oxide film reduces generation of voids, but leaves a buried oxide film. And, a native oxide film cannot prevent voids sufficiently. Consequently, it has been difficult to produce a direct bonded wafer in which voids are reduced sufficiently.

Furthermore, reducing voids requires reduction of particles and so on at the junction interface, and uniform conditions of the junction plane. However, either requirement does not meet production level currently.

DISCLOSURE OF THE INVENTION

The present invention is accomplished in view of the aforementioned problems, and its object is to provide a method for producing a direct bonded wafer in which generation of voids is reduced, and a direct bonded wafer with a low void count which can be used for semiconductor devices.

In order to achieve the aforementioned object, according to the present invention, there is provided a method for producing a direct bonded wafer comprising: forming a thermal oxide film or a CVD oxide film on a surface of at least one of a bond wafer and a base wafer, and bonding the wafer to the other wafer via the oxide film; subsequently thinning the bond wafer to prepare a bonded wafer; and thereafter conducting a process of annealing the bonded wafer under an atmosphere including any one of an inert gas, hydrogen and a mixed gas of an inert gas and hydrogen so that the oxide film between the bond wafer and the base wafer is removed to bond the bond wafer directly to the base wafer.

As mentioned above, firstly, a thermal oxide film or a CVD oxide film is formed on a surface of at least one of a bond wafer for forming a thin-film layer in which devices are fabricated and a base wafer to be a support wafer. The wafer is bonded to the other wafer via the oxide film. As a result, generation of voids and particles can be reduced at the bonding interface. Secondly, the bond wafer is thinned, and a bonded wafer is prepared. Then, the bonded wafer undergoes an annealing process under an atmosphere including any one of an inert gas, hydrogen and a mixed gas of an inert gas and hydrogen. In the process, oxygen in the wafer is out-diffused, and the oxide film is reduced. The oxide film diminishes and eventually vanishes. Thus the bond wafer is directly bonded to the base wafer, and a direct bonded wafer in which voids are reduced can be produced.

In the above case, a silicon wafer may be used as the base wafer, and a wafer except a silicon wafer or a silicon wafer different from the base wafer in orientation may be used as the bond wafer.

As mentioned above, a silicon wafer is used as the base wafer. And a wafer except a silicon wafer such as a silicon-germanium mixed crystal wafer, or a silicon wafer different from the base wafer in orientation is used as the bond wafer. As a result, for example, a direct bonded wafer with high device operating speed can be produced.

Furthermore, it is preferable that the thinning of the bond wafer is conducted by a process at least including ion implantation delamination method.

Ion implantation provides precise control of implantation depth. Ions are implanted at a desired depth of the bond wafer to form an ion implanted layer. After wafers are bonded, the bond wafer can be delaminated at the ion implanted layer. In this way, the bond wafer can be thinned with precisely adjusting the remaining thickness of the bond wafer.

In the above cases, it is preferable that the thinning is conducted so that the bond wafer has a thickness of 150 nm or more.

Conducting the annealing process after the thinning can cause enlargement of defects, generation of pits, and so on. However, when the bond wafer is thinned so that the bond wafer has a thickness of 150 nm or more, enlargement of defects, and generation of pits and voids caused in the annealing process can be reduced further in comparison with the case of the bond wafer being thinned to have a thickness of less than 150 nm. Consequently, a direct bonded wafer with high quality can be produced.

Furthermore, it is preferable that after the thinning and before the process of annealing, the bonded wafer is polished so that a PV value (the difference between maximum positive and maximum negative in a measured range of $10\,\mu m \times 10\,\mu m$) of surface roughness of the wafer becomes 20 nm or less.

In this manner, after the bond wafer is thinned and before the process of annealing, the prepared bonded wafer is polished so that a PV value of surface roughness of the wafer becomes 20 nm or less. As a result, enlargement of defects, and generation of pits and voids caused due to the process of annealing can be reduced further in comparison with the case of the PV value being greater than 20 nm. Consequently, a direct bonded wafer with high quality can be produced.

Furthermore, it is preferable that argon gas is used as the inert gas for an atmosphere of the process of annealing.

Use of argon gas as the inert gas for an atmosphere of the process of annealing enables effective vaporization of the oxide film. Argon is commonly used and is preferably used.

Furthermore, it is preferable that an annealing temperature is 1100 degrees C. or more in the process of annealing.

The annealing temperature of 1100 degrees C. or more brings about out-diffusion of oxygen in the vicinity of the wafer surface. Then, oxygen concentration decreases, the oxide film is reduced, and oxygen diffuses to a region of a silicon layer in which oxygen concentration becomes low. In this way, oxygen is out-diffused and the oxide film is reduced further, and eventually the oxide film vanishes. Consequently, a direct bonded wafer in which the silicon layer, namely the bond wafer is bonded directly to the base wafer can be produced efficiently.

And, it is possible that the bond wafer is thinned further to a desired thickness after the direct bonding.

In this manner, after the bond wafer is bonded directly to the base wafer, the bond wafer is thinned further to a desired thickness suitable for an application to give a product.

Use of the production methods as mentioned above provides a direct bonded wafer in which the bond wafer is bonded directly to the base wafer.

The present invention provides a direct bonded wafer with high quality in which generation of voids is reduced.

The present invention provides a direct bonded wafer in which a silicon thin-film layer is bonded directly to a base wafer, and a count of voids in which the silicon thin-film layer is not bonded to the base wafer is $0.02/cm^2$ or less.

Such a direct bonded wafer with a void count of $0.02/cm^2$ or less is of excellent quality and suitable for semiconductor devices.

Incidentally, the "desired thickness" means a thickness of the bond wafer of a final product.

According to the method for producing a direct bonded wafer of the present invention, when a thermal oxide film or a CVD oxide film is formed on a surface of at least one of a bond wafer and a base wafer, and the wafer is bonded to the other wafer via the oxide film, generation of particles, voids and so on at the bonding portion can be reduced. Next, the bond wafer is thinned to prepare a bonded wafer. Thereafter a process of annealing the bonded wafer under an atmosphere including any one of an inert gas, hydrogen and a mixed gas of an inert gas and hydrogen is conducted, so that the oxide film between the bond wafer and the base wafer is removed to bond the bond wafer directly to the base wafer. As a result, generation and enlargement of defects such as voids can be reduced, and a direct bonded wafer of high quality with extremely low void count can be produced.

Furthermore, a direct bonded wafer according to the present invention in which a silicon thin-film layer is bonded directly to a base wafer, and a count of voids in which the silicon thin-film layer is not bonded to the base wafer is $0.02/cm^2$ or less, has extremely low void count and is of sufficiently high quality. Thus such a direct bonded wafer can be used for semiconductor devices.

BRIEF EXPLANATION OF THE DRAWINGS

FIG. 6 shows a flowchart illustrating a method for producing a direct bonded wafer, according to an embodiment of the disclosed invention.

BEST MODE FOR CARRYING OUT THE INVENTION

Figure 1:
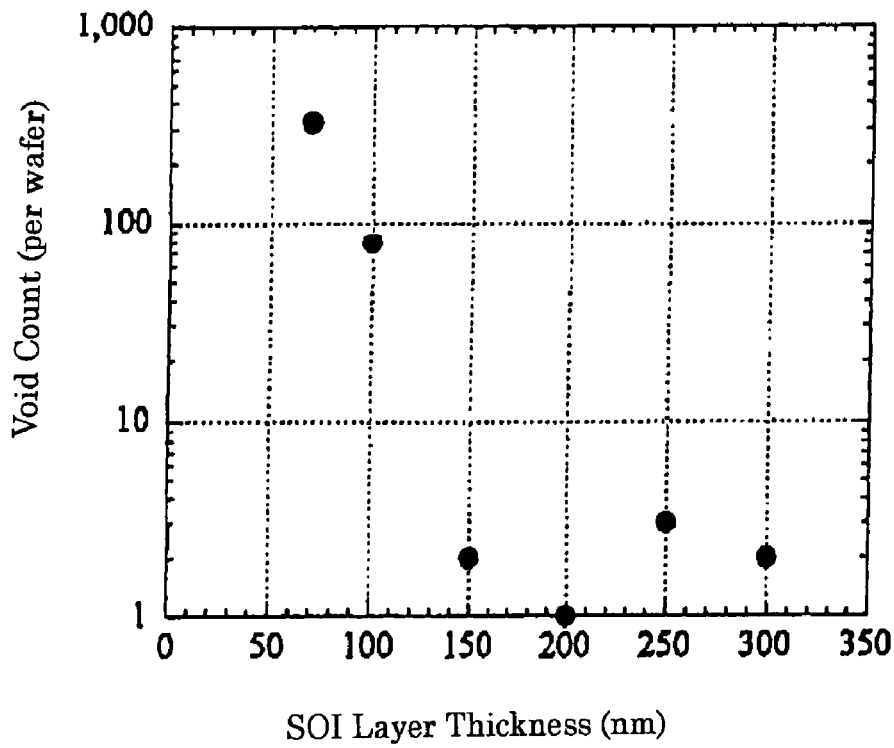
FIG. 1 shows measured results of void count after annealing in Examples 1 to 6.

Hereinafter, embodiments of the present invention will be explained. However, the present invention is not limited thereto.

Joining Si wafers together directly without sandwiching an insulator film such as an oxide film causes considerable generation of voids in the junction plane. There is a fact that bonding wafers either or both of which is thermally oxidized to have a thermal oxide film with a thickness on the surface produces less voids than the case of bonding wafers together directly. However, the method cannot provide a direct bonded wafer because the oxide film remains at the bonding interface.

And there is a method for producing a direct bonded wafer in which wafers with a native oxide film are bonded together at room temperature and undergo a heat treatment under an atmosphere except oxidizing atmosphere to diffuse and remove the oxide film layer at the bonding portion. However, the present inventors' experiments have revealed that, in fact, a native oxide film is too thin (generally a thickness of 2 nm or less) to adsorb water sufficiently which causes generation of voids at the bonding interface at the time when the wafers are bonded. Thus void count cannot be reduced enough. It is thought that this is based on such a reason that a native oxide film is ultra thin, have a nonuniform thickness, can be contaminated by heavy-metals, and so on.

Then, the present inventors have found a method for producing a direct bonded wafer comprising: forming a thermal oxide film or a CVD oxide film on a surface of at least one of a bond wafer and a base wafer, and bonding the wafer to the other wafer via the oxide film; subsequently thinning the bond wafer to prepare a bonded wafer; and thereafter conducting a process of annealing the bonded wafer under an atmosphere including any one of an inert gas, hydrogen and a mixed gas of an inert gas and hydrogen so that the oxide film between the bond wafer and the base wafer is removed to bond the bond wafer directly to the base wafer.

According to such a production method, firstly, a thermal oxide film or a CVD oxide film is formed on a surface of at least one of a bond wafer and a base wafer, and the wafer is bonded to the other wafer via the oxide film. As a result, particles are reduced at the bonding interface. Moreover, the oxide film adsorbs water sufficiently generated at the interface of wafers at the time when the wafers are bonded, and generation of voids can be reduced. This results from the fact that the thermal oxide film and the CVD oxide film are thick, generally 5 nm or more thick, and those films that are dense and have uniform thickness can be easily obtained with high purity. Next, the bond wafer is thinned. Thereafter a process of annealing is conducted under an atmosphere including any one of an inert gas, hydrogen and a mixed gas of an inert gas and hydrogen. Consequently, the oxide film between the bond wafer and the base wafer can be removed, and a direct bonded wafer of high quality with extremely low void count can be produced. To conduct the annealing after the thinning enables efficient removal of the oxide film.

Such a method according to the present invention provides a direct bonded wafer in which a silicon thin-film layer is bonded directly on to a base wafer, and a void count is $0.02/cm^2$ or less. Such a wafer has extremely low void count, is of sufficiently high quality and can be used for semiconductor devices.

Thus, the present inventors have found what is mentioned above and have accomplished the present invention.

Hereinafter, an embodiment of the present invention will be described.

First, two wafers to be a bond wafer and a base wafer are prepared. To produce a direct bonded wafer with a silicon layer, a silicon wafer is used as the base wafer. As the bond wafer, a silicon wafer as with the base wafer can be used. In addition, for example, a wafer except a silicon wafer, a silicon wafer different from the base wafer in orientation, and so on may be used as the bond wafer. The wafer except a silicon wafer is, for example, a silicon-germanium mixed crystal wafer, but the wafer is not limited to the mixed crystal wafer. As for the silicon wafer different in orientation, for example, a bond wafer with a plane orientation of (110) and a base wafer with (100) are used. As a result of this, a device with high operating speed can be obtained because a thin-film layer in which devices are fabricated has a plane orientation of (110). And cost reduction and so on can be promoted because the (100) wafer for general purpose use is used as the base wafer.

Second, at least one of a bond wafer and a base wafer undergoes a heat treatment, and a thermal oxide film is formed on the wafer surface. Formation of such a thermal oxide film, for example, with a thickness of 30 nm, which is thicker than a native oxide film, can reduce generation of particles at the time when the two wafers are bonded. Moreover, generation of voids can be reduced because the thermal oxide film adsorbs water sufficiently which is generated at the time of bonding at an interface of the wafers, and the thermal oxide film is dense and has a uniform thickness. Oxidizing conditions are not particularly limited, and any commonly-used method can be used. For example, the heat treatment may be conducted under a dry oxygen atmosphere, a steam atmosphere, or other oxidizing gas atmosphere, in 600 degrees C. to 1300 degrees C., for 1 second to 10 hours.

Then, the two wafers are bonded via the thermal oxide film, and heat-treated in high temperature (for example, at 1000 degrees C.) to bond the wafers together firmly. After that, the bond wafer is thinned, for example, by grinding, polishing, etching, or the like. Thus a bonded wafer (an SOI wafer) is prepared.

Incidentally, at this moment, the bond wafer may be thinned with ion implantation delamination method. In this method, at the start, for example, hydrogen ions are implanted to the bond wafer to form an ion implanted layer. Then, the bond wafer in which the ion implanted layer is formed and the base wafer are bonded together via the thermal oxide film which is formed earlier, and the wafers undergoes a heat treatment (at approximately 300 degrees C.) to bond the two wafers together. After that, a heat treatment is conducted, for example, at approximately 500 degrees C., to make the bonding firm and to thin the bond wafer by delaminating a part of the bond wafer at the ion implanted layer. By the way, to bond the bond wafer and the base wafer more firmly, the wafers may undergo a heat treatment in high temperature (for example, at approximately 1000 degrees C. to 1200 degrees C.) after the thinning. Furthermore, for example, the wafers may be polished to adjust the thickness. As mentioned above, the bonded wafer can be produced by conducting a process at least including ion implantation delamination method to thin the bond wafer. Use of the method provides a thin film with an extremely uniform thickness distribution.

At this moment, when the bond wafer is thinned so that the bond wafer is left with a thickness of 150 nm or more, generation or enlargement of defects such as voids can be reduced further efficiently in comparison with the case of the bond wafer being thinned to be left with a thickness of less than 150 nm.

In addition, after the thinning and before the process of annealing, the bonded wafer may be polished so that a PV value of surface roughness of the bonded wafer becomes 20 nm or less. As a result, generation or enlargement of defects such as voids can be reduced further efficiently in comparison with the case of the PV value being greater than 20 nm.

Next, the bonded wafer undergoes an annealing process under an atmosphere including any one of an inert gas, hydrogen and a mixed gas of an inert gas and hydrogen. For example, argon gas is preferably used as the inert gas. When a temperature at the annealing is, for example, 1100 degrees C. or more, oxygen in a silicon layer is out-diffused and oxygen concentration of the silicon layer decreases under such a high temperature. At this moment, the thermal oxide film between the silicon layer (the bond wafer) and the base wafer is reduced, and oxygen diffuses to the silicon layer. This diffusion continues and eventually the thermal oxide film is removed. Thus a direct bonded wafer in which the silicon layer is bonded directly to the base wafer can be obtained.

In addition, after the direct bonding of the bond wafer and the base wafer, the bond wafer can be thinned to a desired thickness suitable for a use to provide a product. This thinning can be conducted by commonly-used techniques such as polishing or etching.

In this way, a direct bonded wafer with high quality and with extremely low void count can be obtained by the production method according to the present invention.

A direct bonded wafer according to the present invention has an extremely low void count of $0.02/cm^2$ or less and is of good quality. Consequently, such a wafer can be used for various semiconductor devices.

The case of bonding wafers via a thermal oxide film is described above. A CVD oxide film can be used instead of the thermal oxide film as with the case.

Hereinafter, the present invention will be explained further in detail with reference to Examples and Comparative Examples. However, the present invention is not limited thereto.

EXAMPLES 1 TO 6

As a bond wafer, six Si wafers with a plane orientation of (110) and with a diameter of 12 inches (30.48 cm) were prepared. Each wafer underwent a heat treatment at 900 degrees C. for 5 minutes under a steam atmosphere to grow a 30 nm thick thermal oxide film on the surface of the bond wafer. Next, hydrogen ions were implanted to the respective bond wafers at an implantation depth of 400 nm. The bond wafers were superposed on six Si wafers with (100) which were prepared separately as base wafers via the thermal oxide film, respectively. The wafers underwent a heat treatment at 500 degrees C. for 30 minutes under nitrogen atmosphere to bond the wafers together, and also to separate the wafers at the hydrogen ion implanted layers. After that, a heat treatment at 1100 degrees C. for 1 hour under argon atmosphere was conducted to enhance bonding strength. At that moment, it was confirmed that generation of voids was reduced.

Then, the bond wafer sides of these wafers were thinned by CMP (Chemical Mechanical Polishing method). As a result, the silicon layers (SOI layers) on the bond wafer sides before an annealing process had respective thickness of 70 nm (Example 1), 100 nm (Example 2), 150 nm (Example 3), 200 nm (Example 4), 250 nm (Example 5), and 300 nm (Example 6).

These wafers were annealed at 1200 degrees C. under argon atmosphere with adjusting annealing time respectively so that the thermal oxide film with a thickness of approximately 5 nm was left. This is because it is impossible to measure a thickness of an SOI layer unless approximately 5 nm thick thermal oxide film remains. The thermal oxide film is an oxide film layer (a BOX layer) between the bond wafer and the base wafer.

After the thickness was measured, the annealing was conducted with the same conditions, in total for 5 hours.

In Examples 1 to 6, the annealing for 5 hours resulted in 0 thickness of the thermal oxide film that was a BOX layer.

Figure 2:
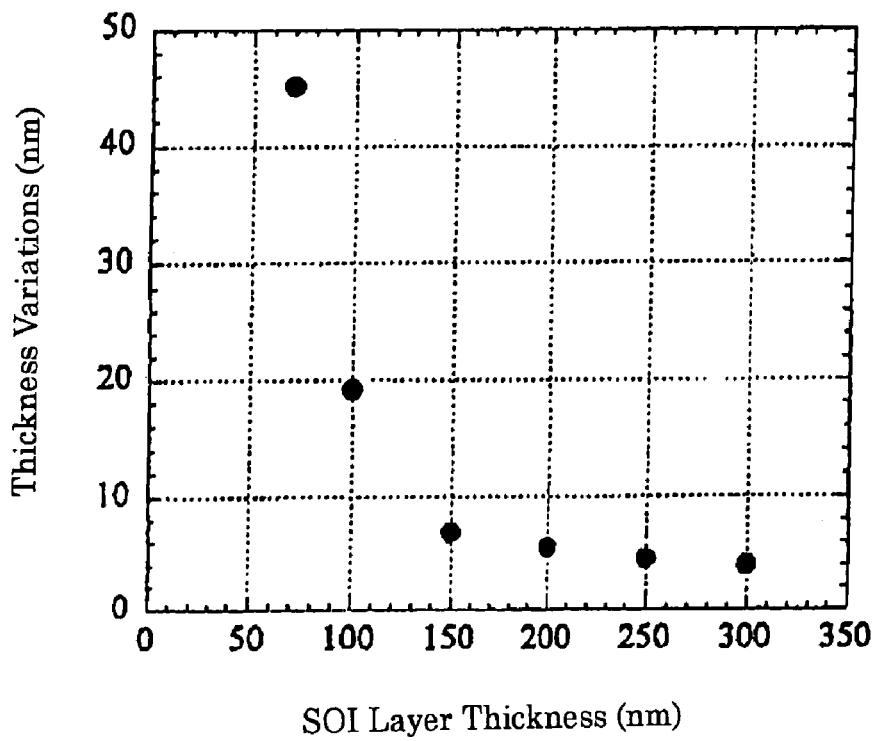
FIG. 2 shows measured results of film thickness variations after annealing in Examples 1 to 6.

Thus a direct bonded wafer in which the bond wafer was bonded directly to the base wafer was obtained. Measurement results of void counts, and so on, of the direct bonded wafers in Examples 1 to 6 are shown in FIG. 1, FIG. 2 and Table 1.

The void count of Examples 1 and 2 were more than those of Examples 3 to 6. The void count of Example 1 was 0.4/cm$^2$, and the void count of Example 2 was 0.1/cm$^2$.

Incidentally, when the SOI layer has a thin thickness of 100 nm or less, the void count after annealing for 1 hour was almost equal to that after annealing for 4 hours.

In Examples 3 to 6, every void count was 3 per wafer (0.004/cm$^2$) or less. Such a direct bonded wafer with a low void count can be used for semiconductor devices.

As for thickness variations (the difference between a maximum value and a minimum value among approximately 4000 values which were obtained by measuring the thickness in the wafer plane at an interval of 4 mm) after the annealing, the thickness distribution in Examples 3 to 6 less varied than that in Examples 1 and 2.

Void counts were larger in Examples 1 and 2 than those in Examples 3 to 6. It is thought that this is because a thinner thickness of the SOI layer leads to a larger diffusion amount of oxygen, and a reaction equivalent to etching occurs. However, the void counts were lower than that of a wafer in Comparative Example 1 as explained hereafter which had a silicon layer of the same thickness and was obtained by bonding wafers together directly without forming a thermal oxide film on the surface of the wafers.

In summary, when the thinning is conducted so that the SOI layer has a thickness of 150 nm or more before the annealing, a direct bonded wafer with an extremely low void count and with higher quality can be produced.

TABLE 1

| Thickness of SOI layer (nm) | Thickness Variations (nm) | Void Count (per wafer) |
|---|---|---|
| 70 | 45 | 324 |
| 100 | 19.2 | 79 |
| 150 | 6.9 | 2 |
| 200 | 5.5 | 1 |
| 250 | 4.6 | 3 |
| 300 | 3.9 | 2 |

EXAMPLES 7 TO 12

As a bond wafer, six Si wafers with a plane orientation of (110) and with a diameter of 12 inches (30.48 cm) were prepared. Each wafer underwent a heat treatment at 900 degrees C. for 5 minutes under a steam atmosphere to grow a 30 nm thick thermal oxide film on the surface of the bond wafer. Next, hydrogen ions were implanted to the respective bond wafers at an implantation depth of 400 nm. The bond wafers were superposed on six Si wafers with (100) which were prepared separately as base wafers via the thermal oxide film, respectively. The wafers underwent a heat treatment at 500 degrees C. for 30 minutes under nitrogen atmosphere to bond the wafers together, and also to separate the wafers at the hydrogen ion implanted layers. After that, a heat treatment at 1100 degrees C. for 1 hour under argon atmosphere was conducted to enhance bonding strength. At that moment, it was confirmed that generation of voids was reduced.

Then, the bond wafer sides of these wafers were thinned by CMP polishing. As a result, all of the SOI layers before an annealing process had respective thickness of 150 nm.

Furthermore, at this moment, CMP conditions were adjusted so that respective PV values of surface roughness of the SOI layers became 2 nm (Example 7), 5 nm (Example 8), 10 nm (Example 9), 20 nm (Example 10), 30 nm (Example 11), and 50 nm (Example 12).

These wafers were annealed at 1200 degrees C. under argon atmosphere with adjusting annealing time respectively so that the thermal oxide film with a thickness of approximately 5 nm remained.

After the thickness was measured, the annealing was conducted with the same conditions, in total for 5 hours.

Figure 3:
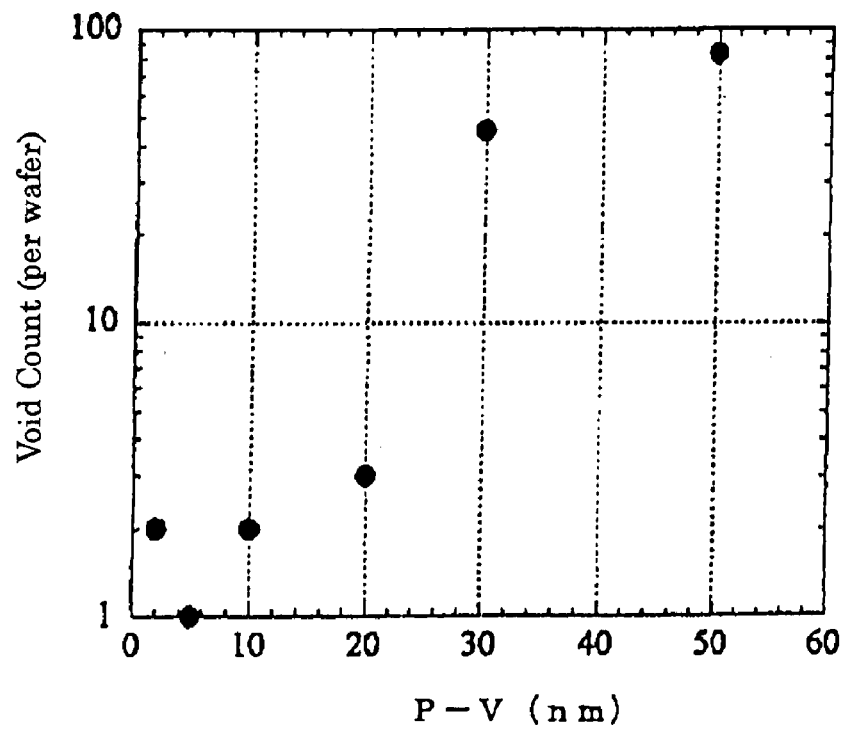
FIG. 3 shows measured results of void count after annealing in Examples 7 to 12.
Figure 4:
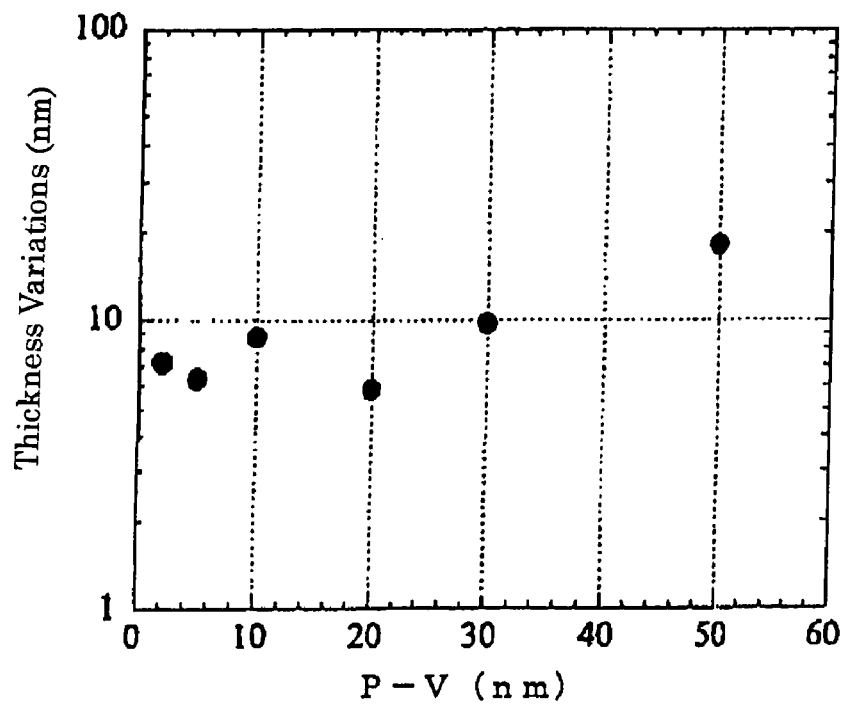
FIG. 4 shows measured results of film thickness variations after annealing in Examples 7 to 12.

In Examples 7 to 12, the annealing for 5 hours resulted in 0 thickness of the thermal oxide film that was a BOX layer. Thus a direct bonded wafer in which the bond wafer was bonded directly to the base wafer was obtained. Measurement results of void counts, and so on, of the direct bonded wafers in Examples 7 to 12 are shown in FIG. 3, FIG. 4 and Table 2.

In Examples 7 to 10, every void count was 3 per wafer (0.004/cm$^2$) or less. Such a direct bonded wafer with a low void count can be used for semiconductor devices.

The void count of Examples 11 and 12 were more than those of Examples 7 to 10. The void count of Example 11 was 0.06/cm$^2$, and the void count of Example 12 was 0.1/cm$^2$.

As for thickness variations after the annealing, the thickness distribution in Examples 7 to 10 less varied to some degree than that in Examples 11 and 12.

From Examples 7 to 12, it has been found that surface roughness of the SOI layer before the annealing also influences void count after the annealing.

When a PV value of surface roughness of the SOI layer before the annealing is 20 nm or less, a direct bonded wafer of higher quality with an extremely low void count can be produced.

TABLE 2

| P-V (nm) | Thickness Variations (nm) | Void Count (per wafer) |
|---|---|---|
| 2 | 7.2 | 2 |
| 5 | 6.3 | 1 |
| 10 | 8.7 | 2 |
| 20 | 5.8 | 3 |
| 30 | 9.7 | 45 |
| 50 | 18 | 83 |

EXAMPLE 13

As a bond wafer, Si wafer with (110) and with a diameter of 12 inches (30.48 cm) was prepared. The wafer underwent a heat treatment at 900 degrees C. for 5 minutes under a steam atmosphere to grow a 30 nm thick thermal oxide film on the surface of the bond wafer. Next, hydrogen ions were implanted to the bond wafer at an implantation depth of 400 nm. The bond wafer was superposed on a (100) Si wafer which was prepared separately as base wafers via the thermal oxide film. The wafers underwent a heat treatment at 500 degrees C. for 30 minutes under nitrogen atmosphere to bond the wafers together, and also to separate the wafers at the hydrogen ion implanted layer. After that, a heat treatment at 1100 degrees C. for 1 hour under argon atmosphere was conducted to enhance bonding strength. At that moment, it was confirmed that generation of voids was reduced.

Then, the wafer was thinned by CMP polishing to have an SOI layer thickness of 250 nm before an annealing process. PV value was 25 nm.

This wafer was annealed at 1200 degrees C. for 5 hours under argon atmosphere.

In Example 13, the annealing resulted in 0 thickness of the thermal oxide film. Thus a direct bonded wafer in which the bond wafer was bonded directly to the base wafer was obtained. The measurement result of void count of the direct bonded wafer in Example 13 is shown in FIG. 5.

Figure 5:
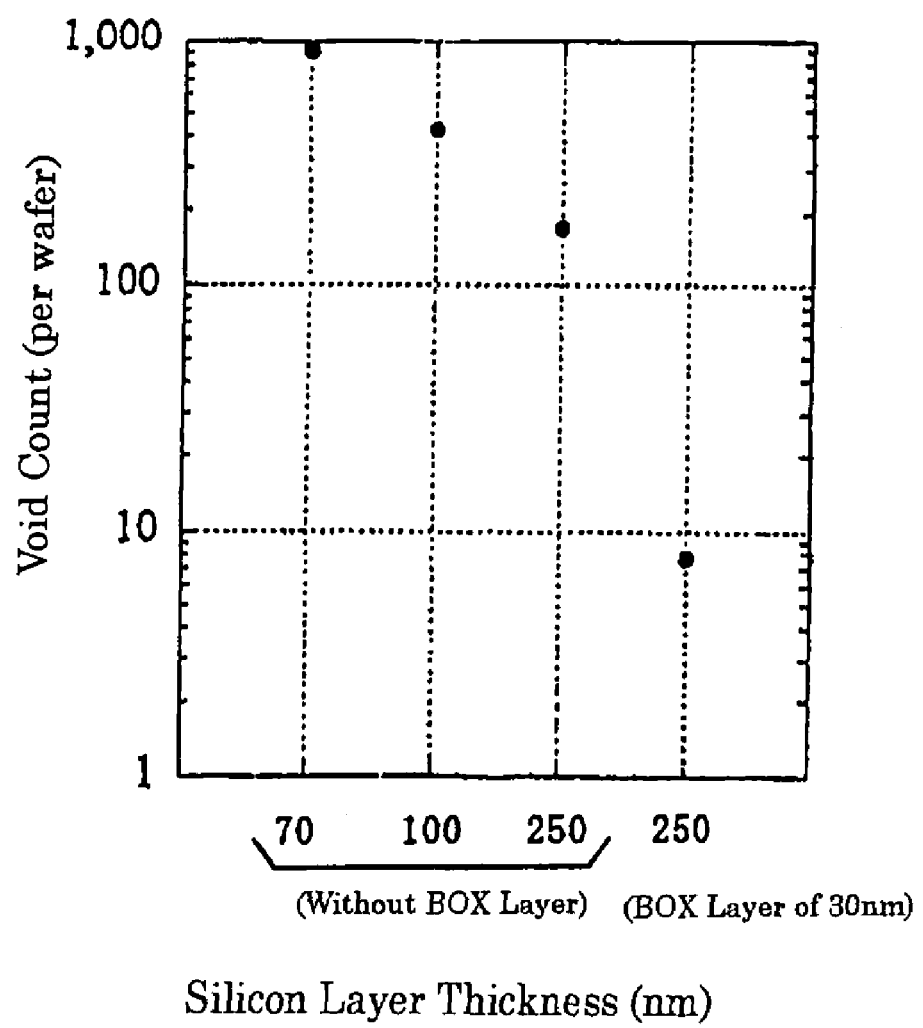
FIG. 5 shows measured results of void count after annealing in Example 13 and in Comparative Examples 1 to 3.

The void count of the direct bonded wafer produced by the method for producing a direct bonded wafer according to the present invention was extremely low of 8 per wafer (0.01/$cm^2$) as shown at 250 nm (BOX 30 nm) in the graph of FIG. 5. Thus a direct bonded wafer of high quality was obtained. Such a wafer is adequate for being used for semiconductor devices.

COMPARATIVE EXAMPLES 1 TO 3

As a bond wafer, three Si wafers with (110) and with a diameter of 12 inches (30.48 cm) were prepared. Hydrogen ions were implanted to the respective bond wafers at an implantation depth of 400 nm. The bond wafers were superposed on (100) Si wafers which were prepared separately as base wafers, respectively. The wafers underwent a heat treatment at 350 degrees C. for 2 hours under nitrogen atmosphere to bond the wafers together. Then, the wafers were separated at the hydrogen ion implanted layers by a heat treatment at 500 degrees C. for 30 minutes under nitrogen atmosphere.

Then, the bond wafer sides of these wafers were thinned by CMP polishing to provide direct bonded wafers. As a result, the silicon layers on the bond wafer sides had thickness of 70 nm (Comparative Example 1), 100 nm (Comparative Example 2) and 250 nm (Comparative Example 3). And void counts of the wafers were measured.

Measurement results in Comparative Examples 1 to 3 are shown at 70 nm (without BOX Layer), 100 nm (without BOX Layer), 250 nm (without BOX Layer) in the graph of FIG. 5.

As shown in the graph of FIG. 5, the direct bonded wafers of Comparative Examples 1 to 3 had respective void counts of 940 per wafer ($1.3/cm^2$), 420 per wafer ($0.58/cm^2$), and 190 per wafer ($0.26/cm^2$). Thus large amount of voids were generated.

As is evident from Examples 1, 2, and 13, and Comparative Examples 1 to 3, generation of voids are reduced in a direct bonded wafer which is obtained by forming a thermal oxide film, bonding via the oxide film and subsequently removing the thermal oxide film by annealing, as compared to a direct bonded wafer in which a bond wafer is directly bonded to a base wafer without forming a thermal oxide film. Thus the present invention provides a direct bonded wafer of higher quality which can be used for semiconductor devices.

In addition, as is evident from Examples 1 to 6, in thinning, when the bond wafer is thinned so that the bond wafer is left with a thickness of 150 nm or more, a direct bonded wafer of higher quality with an extremely low void count can be produced, in comparison with the case of the bond wafer being thinned to have a thickness of less than 150 nm.

Furthermore, as is evident from Examples 7 to 12, when the bonded wafer is polished so that a PV value of surface roughness of the wafer becomes 20 nm or less after the thinning and before the process of annealing, a direct bonded wafer of higher quality with an extremely low void count can be produced, in comparison with the case of the PV value being greater than 20 nm.

The present invention is not limited to the embodiment described above. The above-described embodiment is mere an example, and those having substantially the same structure as technical ideas described in the appended claims and providing the similar functions and advantages are included in the scope of the present invention.

The invention claimed is:

1. A method for producing a direct bonded wafer comprising: forming a thermal oxide film or a CVD oxide film on a surface of at least one of a bond wafer and a base wafer, and bonding the wafer to the other wafer via the oxide film; subsequently thinning the bond wafer to prepare a bonded wafer; and thereafter conducting a process of annealing the bonded wafer under an atmosphere including any one of an inert gas, hydrogen and a mixed gas of an inert gas and hydrogen so that the oxide film between the bond wafer and the base wafer is removed to bond the bond wafer directly to the base wafer.

2. The method for producing a direct bonded wafer according to claim 1, wherein a silicon wafer is used as the base wafer, and a wafer except a silicon wafer or a silicon wafer different from the base wafer in orientation is used as the bond wafer.

3. The method for producing a direct bonded wafer according to claim 1, wherein the thinning of the bond wafer is conducted by a process at least including ion implantation delamination method.

4. The method for producing a direct bonded wafer according to claim 1, wherein the thinning is conducted so that the bond wafer is left with a thickness of 150 nm or more.

5. The method for producing a direct bonded wafer according to claim 1, wherein after the thinning and before the process of annealing, the bonded wafer is polished so that a PV value of surface roughness of the wafer becomes 20 nm or less.

6. The method for producing a direct bonded wafer according to claim 1, wherein argon gas is used as the inert gas.

7. The method for producing a direct bonded wafer according to claim 1, wherein an annealing temperature is 1100 degrees C. or more in the process of annealing.

8. The method for producing a direct bonded wafer according to claim 1, wherein the bond wafer is thinned further to a desired thickness after the direct bonding.

9. The method for producing a direct bonded wafer according to claim 2, wherein after the thinning and before the process of annealing, the bonded wafer is polished so that a PV value of surface roughness of the wafer becomes 20 nm or less.

10. The method for producing a direct bonded wafer according to claim 2, wherein the thinning of the bond wafer is conducted by a process at least including ion implantation delamination method.

11. The method for producing a direct bonded wafer according to claim 2, wherein the thinning is conducted so that the bond wafer is left with a thickness of 150 nm or more.

12. The method for producing a direct bonded wafer according to claim 3, wherein the thinning is conducted so that the bond wafer is left with a thickness of 150 nm or more.

13. The method for producing a direct bonded wafer according to claim 3, wherein after the thinning and before the process of annealing, the bonded wafer is polished so that a PV value of surface roughness of the wafer becomes 20 nm or less.

14. The method for producing a direct bonded wafer according to claim 10, wherein the thinning is conducted so that the bond wafer is left with a thickness of 150 nm or more.

15. The method for producing a direct bonded wafer according to claim 10, wherein after the thinning and before the process of annealing, the bonded wafer is polished so that a PV value of surface roughness of the wafer becomes 20 nm or less.

16. The method for producing a direct bonded wafer according to claim 14, wherein after the thinning and before the process of annealing, the bonded wafer is polished so that a PV value of surface roughness of the wafer becomes 20 nm or less.

17. The method for producing a direct bonded wafer according to claim 16, wherein argon gas is used as the inert gas.

18. The method for producing a direct bonded wafer according to claim 17, wherein an annealing temperature is 1100 degrees C. or more in the process of annealing.

19. The method for producing a direct bonded wafer according to claim 18, wherein the bond wafer is thinned further to a desired thickness after the direct bonding.

20. The method for producing a direct bonded wafer according to claim 11, wherein after the thinning and before the process of annealing, the bonded wafer is polished so that a PV value of surface roughness of the wafer becomes 20 nm or less.

21. The method for producing a direct bonded wafer according to claim 12, wherein after the thinning and before the process of annealing, the bonded wafer is polished so that a PV value of surface roughness of the wafer becomes 20 nm or less.

22. The method for producing a direct bonded wafer according to claim 4, wherein after the thinning and before the process of annealing, the bonded wafer is polished so that a PV value of surface roughness of the wafer becomes 20 nm or less.

* * * * *